(12) United States Patent
Hayashi et al.

(10) Patent No.: US 6,791,167 B2
(45) Date of Patent: Sep. 14, 2004

(54) RESIN-MOLDED DEVICE AND MANUFACTURING APPARATUS THEREOF

(75) Inventors: Kenichi Hayashi, Tokyo (JP); Hisashi Kawafuji, Fukuoka (JP); Mitsugu Tajiri, Fukuoka (JP); Taketoshi Shikano, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/386,670

(22) Filed: Mar. 13, 2003

(65) Prior Publication Data

US 2003/0183907 A1 Oct. 2, 2003

(30) Foreign Application Priority Data

Mar. 28, 2002 (JP) ........................................ 2002-090932

(51) Int. Cl.⁷ ............................................. H01L 23/495
(52) U.S. Cl. ........................................ 257/667; 257/787
(58) Field of Search ................................ 257/667, 787, 257/666, 789, 676

(56) References Cited

U.S. PATENT DOCUMENTS

| | | | | |
|---|---|---|---|---|
| 5,767,573 A | * | 6/1998 | Noda et al. | ............ 257/675 |
| 5,969,414 A | * | 10/1999 | Parthasarathi et al. | ...... 257/675 |
| 6,002,166 A | | 12/1999 | Noda et al. | |
| 6,649,447 B1 | * | 11/2003 | Chang et al. | ............... 438/112 |
| 2002/0109211 A1 | | 8/2002 | Shinohara | |

FOREIGN PATENT DOCUMENTS

| | | |
|---|---|---|
| JP | 3-206648 | 9/1991 |
| JP | 4-27145 | 1/1992 |
| JP | 8-213547 | 8/1996 |
| JP | 2000-138342 | 5/2000 |
| JP | 2000-138343 | 5/2000 |

* cited by examiner

Primary Examiner—Phat X. Cao
(74) Attorney, Agent, or Firm—Oblon, Spivak, McClelland, Maier & Neustadt, P.C.

(57) ABSTRACT

A resin-molded device of an aspect of the present invention includes a plurality of electronic elements spaced from each other. It also has a plurality of lead members, each one of the lead members electrically connecting to the corresponding one of the electronic elements. Further, it has a plurality of metal blocks spaced from each other so that a plurality of channel portions are defined between the metal blocks. Each of the metal blocks is arranged so as to correspond to at least one of the electronic elements and the lead members connected to the electronic element. The resin-molded device includes a resin package of electrically insulating material molded so as to hold together the plurality of the electronic elements, the lead members, and the metal blocks. The resin package includes a plurality of resin inlets through which fluid resin is injected, and wherein each of the resin inlets opposes to the corresponding one of the channel portions.

14 Claims, 16 Drawing Sheets

111

RESIN-MOLDED DEVICE AND MANUFACTURING APPARATUS THEREOF

BACKGROUND OF THE INVENTION

1) Technical Field of the Invention

The present invention relates to a resin-molded device having a resin package holding together a plurality of electronic elements, lead frames (lead members), and metal blocks for radiating heat, and also relates to a manufacturing apparatus of the resin-molded device.

2) Description of Related Arts

An example of the resin-molded electronic devices is a power semiconductor device commonly used as a switching inverter device incorporated in an electronic appliance such as an air conditioner and a washing machine. As illustrated in FIG. 22, the power semiconductor device includes, in general, a plurality of lead frames 101, a power element 102, a metal block 103 serving as a heat sink for radiating heat. The power semiconductor device also includes a resin package 104 holding together those above-mentioned components.

The lead frame 101 includes a die pad portion 105 and an inner lead portion 106. The power element 102 is bonded to the upper surface of the die pad portion 106 via solder 107. Also, the power element 102 is electrically connected to the inner lead portion 106 via an aluminum wire 108. A metal block 103 has a plateau portion 109 formed substantially in the middle region of the metal block 102. The plateau portion 109 is arranged beneath the lower surface of the lead frame 101 so as to oppose to power element 102 and spaced from the lower surface of the lead frame 101 with a predetermined gap. A portion of the resin package 104 sandwiched between the plateau portion 109 of the metal block 103 and the lead frame 101 is referred to as a insulating resin layer 110. The power element 102, the lead frames 101, and the metal block 103 are together held in the resin package 104, while the bottom surface of the metal block 103 opposing to the top surface adjacent to the lead frame 101 is uncovered or exposed. Although not shown, an external radiator is secured on the exposed bottom surface of the metal block 103.

In such a conventional power semiconductor device, heat generated by the power element 102 is radiated through the lead frame 101, the insulating resin layer 110, and the metal block 103 to the external radiator. The metal block 103 is made of metal such as aluminum and copper having thermal conductivity of 200 W/m·K and 390 W/m·K, respectively. Since the lead frame 101 is made of metal such as copper, it has thermal conductivity similar to one of the metal block 103. Meanwhile, the insulating resin layer 110 has thermal conductivity of 1–3 W/m·K, which is approximately one-hundredth (1/100) of those of the lead frame 101 and the metal block 103. Therefore, the insulating resin layer 110 has a main controlling factor to the heat conductivity of the power semiconductor device. In other words, an internal heat resistance of the conventional power semiconductor device depends mostly upon the insulating resin layer 110.

The heat resistance or heat radiating performance of a material is determined, in general, based upon a heat radiating thickness, a heat radiating area, and thermal conductivity of the material. Thus, the internal heat resistance of the power semiconductor device may be reduced by thinning the insulating resin layer 110. However, since the dielectric breakdown voltage of the insulating resin layer 110 is required more than several thousands volts, it is known that it can not be thinner than approximately 0.3 mm. This limits improvement of the heat resistance by thinning the insulating resin layer 110.

Thus, in order to further improve the heat radiating performance of the power semiconductor device, the metal block serving as a heat spreader has been proposed, which has a wider surface extending towards the upper stream, thereby increasing the heat radiating surface. In the power semiconductor device including a plurality of power elements, it should also includes a plurality of the metal blocks, which have to be electrically isolated from one another for the necessity of electrical isolation of the power elements from each other. Nonetheless, in a molding step of the resin package of the conventional power semiconductor device including several metal blocks, no special care has been taken to fill up the channels defined between the adjacent metal blocks with resin in a reliable manner. Thus, the conventional power semiconductor device including several metal blocks has several problems to be addressed as described hereinafter.

Referring to FIGS. 23 to 26, the above-mentioned problems will be described herein in detail. FIG. 23 is a top plan view of the conventional semiconductor device before molding the resin package 104. As described in JPA 2000-138343, fluid resin is injected from a plurality of resin runners 111 of a molding die through the corresponding resin inlet of the semiconductor device so as to form the resin package 104. FIG. 24 is a bottom plane view of the conventional semiconductor device schematically illustrating the plurality of the metal blocks 103 and the resin runners 111 while fluid resin is being injected from the resin runners 111 during the resin package molding step. A plurality of channels 112a to 112c are defined between the metal blocks 103 adjacent to each other, and the fluid resin reach into them at a different timing, as shown in FIG. 24. Thus, the front-running resin reached in the channels 112b, 112c pushes the metal blocks 103 towards the channel 112a of the behind-running resin due to the resin injection pressure. The first problem of the conventional semiconductor device is that the metal blocks 103 are shifted so that the channels 112b, 112c of the front-running resin are expanded and the channel 112a of the behind-running resin is pinched.

As above, the fluid resin is filled in the channel 112a some time after filled in the channels 112b, 112c. Thus, the channels 112b, 112c become wider and the channel 112a is narrower than that before the molding step. Since the fluid resin is less likely to reach the narrower channel 112a, completion to fill in the narrower channel 112a is more delayed in comparison with the other channels 112b, 112c. Eventually, the adjacent metal blocks 103 sandwiching the narrower channel 112a may contact with each other so that the electric isolation (insulation) therebetween can not be secured, thereby resulting in the fatal defect of the semiconductor device. Also, in case where the adjacent metal blocks 103 sandwiching the narrower channel 112a have the substantial amount of stress applied thereto, the bonding layers between the lead frames and the metal blocks may have a critical damage.

Secondly, even where contact between the metal blocks are avoided, the fluid resin is less likely injected in the narrower channel 112a so that the resin-unfilled hollow portions are defined therein. This may also cause insufficiency of electrical isolation between the adjacent metal blocks, resulting in the fatal defect of the semiconductor device.

Thirdly, even where shift of the metal blocks is prevented, if air is trapped between the metal blocks and not evacuated, the remaining air forms so-called a "void" so that electrical isolation cannot be secured between the metal blocks. Thus, the usage of the conventional resin runners cause the resin injection timing for each of the channels different from one another, thus, the fluid resin turns around, thereby remaining air between the metal blocks, which is referred to as the void.

Also, FIG. 25 is a schematic bottom view of the conventional semiconductor device similar to FIG. 24, but after the channels are completely filled up with the fluid resin. In this drawing, the running directions of the fluid resin are illustrated by the arrows. As above, the fluid resin is delayed to reach the channel 112a, the channel 112a is filled up not only with the fluid resin directly from the resin runners 111 but also with fluid resin turning around from other channels 112b, 112c. Those fluid resin trap air, thereby forming the void 114 in the channel 112a, which in turn, reduces the isolation performance between the adjacent metal blocks 103.

There is the fourth problem especially in so-called a full-molded semiconductor device, in which the metal blocks are entirely encompassed by the resin package. In such a full-molded semiconductor device, the resin package fully covers the bottom surface of the metal block adjacent to the external radiator so that electric isolation between the metal block and the external radiator can be secured. Nonetheless, also because of the turning-around of the fluid resin, the resin-unfilled portion or void 115 can be formed on an insulating layer adjacent to the bottom surface of the metal blocks as shown in FIG. 26. that is a schematic bottom view of the conventional full-molded semiconductor device similar to FIGS. 24, 25. Because the resin-unfilled portion or void 115 is formed exposing the metal block 103, electric isolation between the metal block and the external radiator cannot be secured, thereby resulting in the product failure.

Therefore, the aspects of the present invention has a purpose to address those problems as described above, and to provide a resin-molded device with a resin package having an improved insulation performance, and a manufacturing apparatus thereof.

SUMMARY OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications within the sprit and scope of the invention will become apparent to those skilled in the art from this detailed description.

The first aspect of the present invention is to provide a resin-molded device including a plurality of electronic elements spaced from each other. It also has a plurality of lead members, each one of the lead members electrically connecting to the corresponding one of the electronic elements. Further, it has a plurality of metal blocks spaced from each other so that a plurality of channel portions are defined between the metal blocks. Each of the metal blocks is arranged so as to correspond to at least one of the electronic elements and the lead members connected to the electronic element. The resin-molded device includes a resin package of electrically insulating material molded so as to hold together the plurality of the electronic elements, the lead members, and the metal blocks. The resin package includes a plurality of resin inlets through which fluid resin is injected, and wherein each of the resin inlets opposes to the corresponding one of the channel portions.

The second aspect of the present invention is to provide a manufacturing apparatus of a resin-molded device, which include a plurality of electronic elements spaced from each other, a plurality of lead members, each one of the lead members electrically connecting to the corresponding one of the electronic elements. In the device, a plurality of metal blocks are spaced from each other so that a plurality of channel portions are defined between the metal blocks. Each of the metal blocks is arranged so as to correspond to at least one of the electronic elements and the lead members connected to the electronic element. The resin-molded device also includes a resin package of electrically insulating material molded so as to hold together the plurality of the electronic elements, the lead members, and the metal blocks. The manufacturing apparatus includes a molding die for molding the resin package. The molding die includes a plurality of runner portions from which fluid resin is injected, and each of the runner portions opposes to the corresponding one of the channel portions.

Further scope of applicability of the present invention will become apparent from the detailed description given hereinafter. However it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention will more fully be understood from the detailed description given hereinafter and accompanying drawings which are given by way of illustration only, and thus are not limitative of the present invention and wherein.

DETAILED DESCRIPTION OF THE PREFERRED EMBODIMENTS

Referring to the attached drawings, the details of embodiments according to the present invention will be described hereinafter. In those descriptions, although the terminology indicating the directions (for example, "upper", "lower", "upwardly", "downwardly", "top", and "bottom") are conveniently used just for clear understandings, it should not be interpreted that those terminology limit the scope of the present invention.

Embodiment 1.

Figure 1:
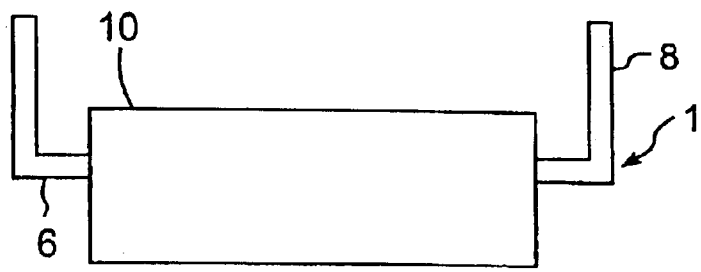
FIG. 1 is a schematic side view of an exemplary resin-molded device having a resin package according to Embodiment 1 of the present invention.
Figure 2:
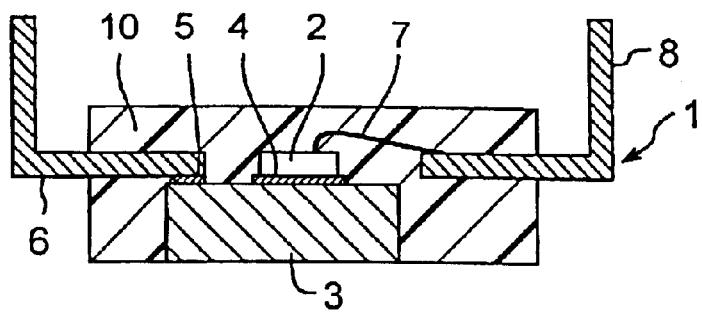
FIG. 2 is a schematic cross sectional view of the semiconductor device of FIG. 1.
Figure 3:
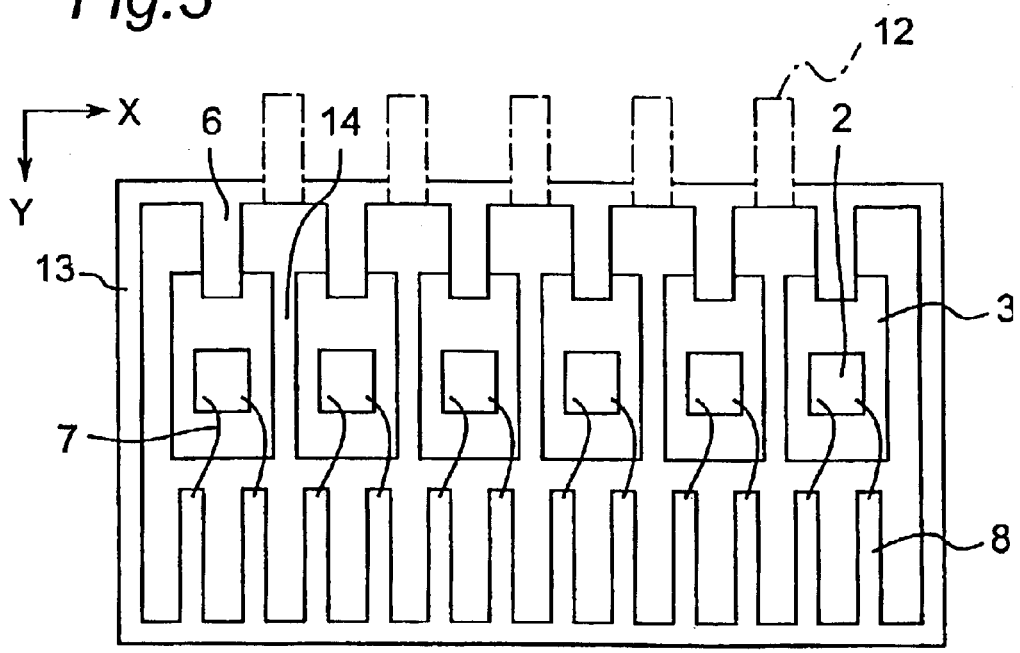
FIG. 3 is a schematic top plane view of the semi-manufactured semiconductor device of FIG. 1 before a resin filling step of a manufacturing process thereof.

A semiconductor device will be described herein as an example of a resin-molded device according to Embodiment 1 of the present invention. FIGS. 1 and 2 are a schematic side and cross sectional views of the semiconductor device 1, respectively. Also, FIG. 3 shows the semi-manufactured semiconductor device of FIG. 1 before a resin filling step of a manufacturing process thereof. In FIG. 3, the semiconductor device 1 includes a plurality of power elements (IC chips) 2 integrating semiconductor circuits. Each of the power elements 2 is attached via solder 4 to a metal block 3 of conductive metal for radiating heat. Also, the metal block 3 is attached and connected via solder 5 to a first lead frame (lead portion) 6. Each of the power elements 2 has a lower electrode (not shown) on the bottom surface opposing to the metal block 3. The lower electrode is electrically connected to the first lead frame 6 via the solder 4, the metal block 3 and the solder 5. The power element 2 has two upper electrodes (not shown) on the top surface, which are electrically connected to a second lead frame (lead portion) 8 via aluminum wires 7. In FIG. 2, both of the first and second lead frames 6 and 8 are bent upwardly. As illustrated in FIGS. 1 and 2, the semiconductor device 1 also includes a resin package 10 of electrically insulating material, which holds and seals the power elements 2, the metal block 3, the lead frames 6 and 8, and the aluminum wires 7, encompassing thereof and exposing the external free ends of the lead frames 6, 8, and the bottom surface of the metal block 3.

A manufacturing process of the semiconductor device 1 of the present invention includes, in general, five steps. That is, in a first step, the power elements 2 are attached or bonded to the metal block 3. In a second step, the metal blocks 3 are attached or bonded to the first lead frames 6. In a third step, the power elements 2 are wire-bonded to the second lead frame 8, and in a fourth step, fluid resin is injected into the cavity of a molding die. In a fifth step, the fluid resin is cured so as to form the resin package 10. FIG. 3 shows the semi-manufactured semiconductor device after the third step and before the fourth step. Also, FIG. 3 illustrates, by imaginary lines, a plurality of resin runners 12 of the molding die used in the fourth step. At this stage of FIG. 3, the first and second lead frames 6, 8 extend in a direction of Y, and have outer ends connected to an outer rectangular frame 13, rather than separated to each other. Thus, the lead frame used for manufacturing the semiconductor device is comprised of the first and second lead frames 6, 8 and outer rectangular frame 13.

As illustrated in FIG. 3, the metal block 3 has a rectangular configuration viewing from the top (from the power element 2), each of which is arranged in a first direction (as indicated by an arrow X) and spaced from adjacent ones. There are a plurality of channels 14 defined between the adjacent metal blocks 3, each of the channels extends in a second direction substantially perpendicular to the first direction (as indicated by an arrow Y). Also, each of the first lead frame 6 attached to the corresponding metal block 3 is arranged and spaced from adjacent ones with a predetermined gap in the first direction.

Figure 4:
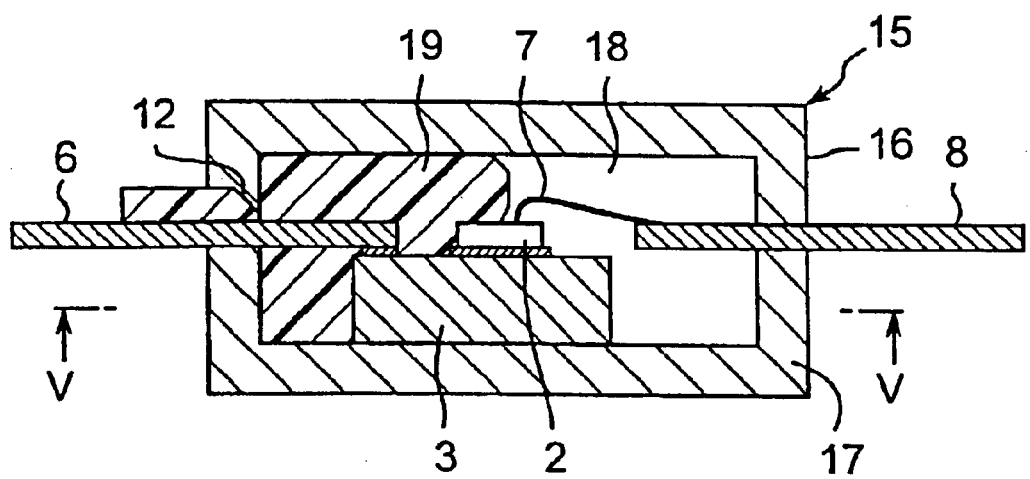
FIG. 4 is a schematic side view of the semi-manufactured semiconductor device during the filling step.
Figure 5:
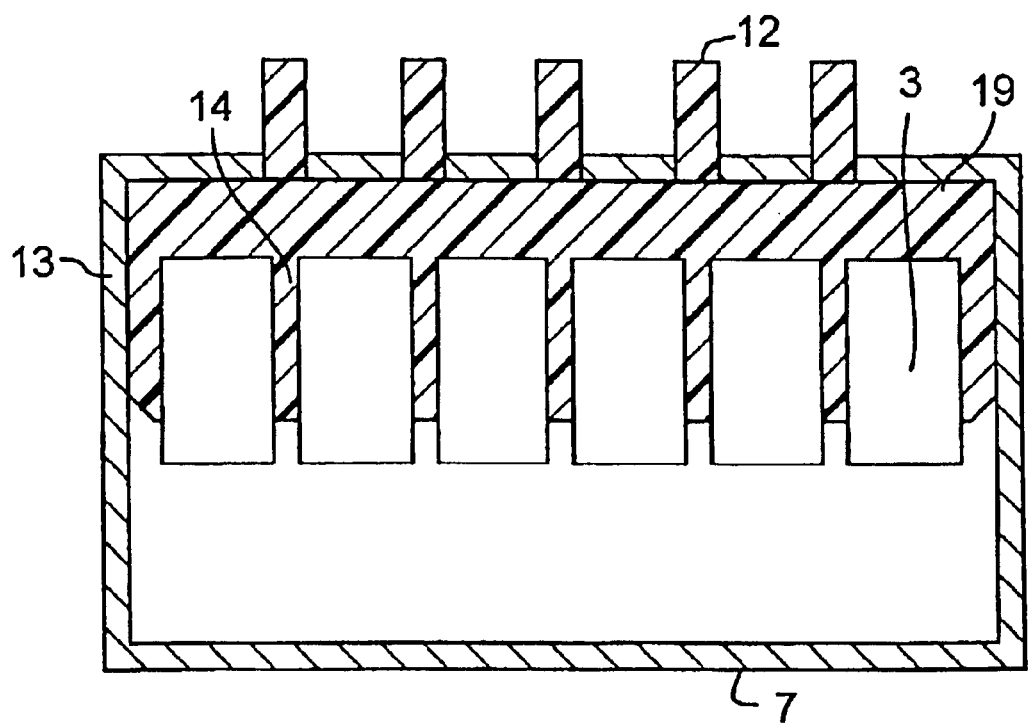
FIG. 5 is a schematic cross sectional view of the semi-manufactured semiconductor device, taken by a line V—V of FIG. 4.

FIG. 4 shows the semi-manufactured semiconductor device of FIG. 3 during the filing step, which is received in the molding die 15. The molding die 15 has two parts, i.e., an upper and lower dice 16, 17 so as to hold the semi-manufactured semiconductor device. Defined between the upper and lower dice 16, 17 is a cavity 18 tracing an outline of the resin package 10 to be molded. The resin runners 12 from which fluid resin is injected are provided on the side walls (left side walls in FIG. 4) of the upper die 16. Also, the resin runners 12 can be provided beneath the positions indicated in FIG. 4 on the side walls of the lower die 17. Although not illustrated in figures, an air-outlet for evacuating air are provided on the opposite side walls (right side walls in FIG. 4) either of the upper and lower dice 16, 17.

According to the present embodiment, as clearly illustrated in FIG. 3, each of the resin runners 12 opposes to the channel 14 and is positioned on an extension line overlapping the channel 14 so that the running resin is injected along the extension line. Also, the resin runners 12 are designed so that each of them is wider than the corresponding channel 14 in the direction X.

In the present embodiment, the filling step can be performed by a transfer-molding or by injection-molding. The upper and lower dice 16, 17 sandwich the semi-manufactured semiconductor device of FIG. 3, and fluid resin runs from the plurality of resin runners 12 through the resin inlets of the semiconductor device so as to mold the resin package 10. As above, each of the resin runners 12 as well as the resin inlets according to the present embodiment opposes to the corresponding channel 14 and is arranged on the extension line overlapping the channel 14 defined between the adjacent metal blocks 3. Therefore, the running resin 19 injected from each resin runner 12 goes forward and thoroughly fills up the corresponding channel 14. Also, since the resin runner 12 is wider than the channel 14, even upstream and downstream ports of the channel 14 adjacent to the inlet 12 and air-outlet (not shown), respectively, are filled up with resin 19 completely. Furthermore, the distance between each resin runner 12 and the corresponding channel 14 is designed to be the same as those between other runners and the corresponding channels. Thus, the fluid resin 19 runs through the channels 14 at the same speed and fills them up at substantially the same timing.

To this result, the metal blocks 3 are prevented from shifting in the direction of the arrow X due to the different timing in filling up the channels 14 with resin. Thus, in the filling step, each of the channels 14 has a width kept unchanged without expansion and shrinkage. Also, the possibility of the void in the channels 14 can be eliminated, in which resin running through the channel 14 might turn around and fill the adjacent channel 14 from the opposite direction of the arrow Y, then air might be trapped in the middle of the channel 14. Therefore, according to Embodiment 1 the channels 14 can be filled up with resin without voids so as to form resin layers in the channels 12 with uniform thickness, which electrically isolate the metal blocks from one another in a reliable manner.

After the filling step, the fluid resin filled in the cavity is cured to form the resin package 10 in a solid state that have a plurality of resin inlets at positions corresponding to the resin runners 12 of the molding die 15. Thus, according to the present embodiment, each of the resin inlets of the semiconductor device 1 opposes to the corresponding channel 14 and is positioned on an extension line overlapping the channel 14.

Meanwhile, the narrower channel 14 between the metal blocks 3 makes it more difficult to be filled up with resin, and also could bring a failure of electrical isolation between the metal blocks 3. Even though the dielectric breakdown voltage required between the metals blocks 3 is often less than that between the metal block 3 and the external radiator, the thickness of resin formed in the channels 14 should be 0.1 mm or more to secure the required breakdown voltage between the adjacent metal blocks 3. On the other hand, our experiment revealed that the channels 14 having width greater than 3 mm did not improve the filling of resin in the channels 14. Thus, no advantage can be obtained with the channels 14 having width greater than 3 mm because it causes greater configuration of the semiconductor device 1. For those reasons, it is preferable that the width of the channels 14 fall within the range between 0.1 mm and 3 mm. More preferably, it falls within the range between 0.3 mm and 2 mm in views of stable injection and filling of resin in the filling step, and as well as minimization of the semiconductor device 1.

Figure 6:
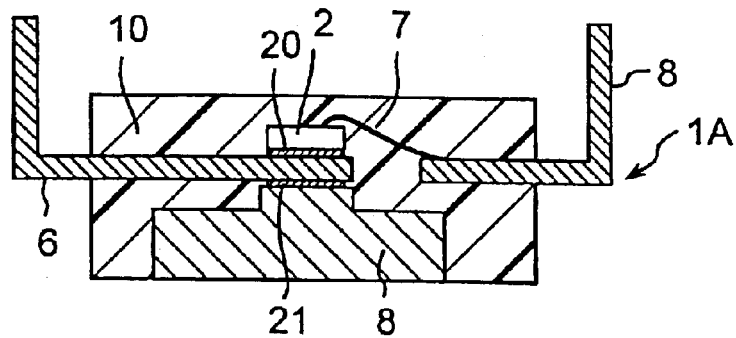
FIG. 6 is a schematic cross sectional view of an another semiconductor device according to Embodiment 1.

Although the exemplary semiconductor device 1 having only the power elements is described above in the present embodiment, it may also have control elements mounted on the first or second lead frame. As described above, according to the present embodiment, the power elements are mounted on the metal blocks 3 in order to optimize the radiating performance of the semiconductor device. However, as shown in FIG. 6, it can be mounted directly on the lead frame 6 in order to facilitate the wire connections between the elements and also to simplify the structure of the semiconductor device 1. In this case, the lead frame 6 is attached via solder layers 20, 21 to the power element 2 and the metal block 3, respectively.

Embodiment 2.

Figure 7:
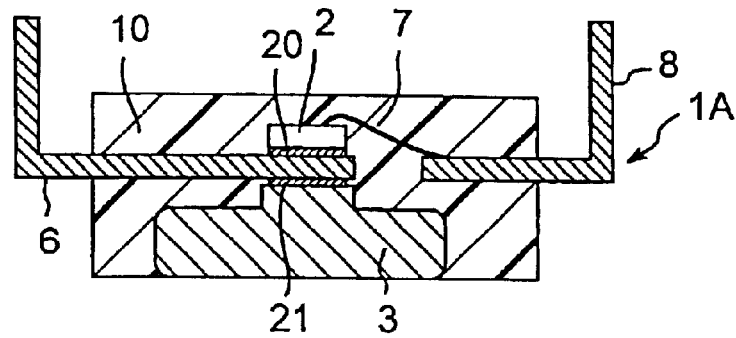
FIG. 7 is a schematic cross sectional view of an exemplary resin-molded device with a resin package according to Embodiment 2 of the present invention.
Figure 8:
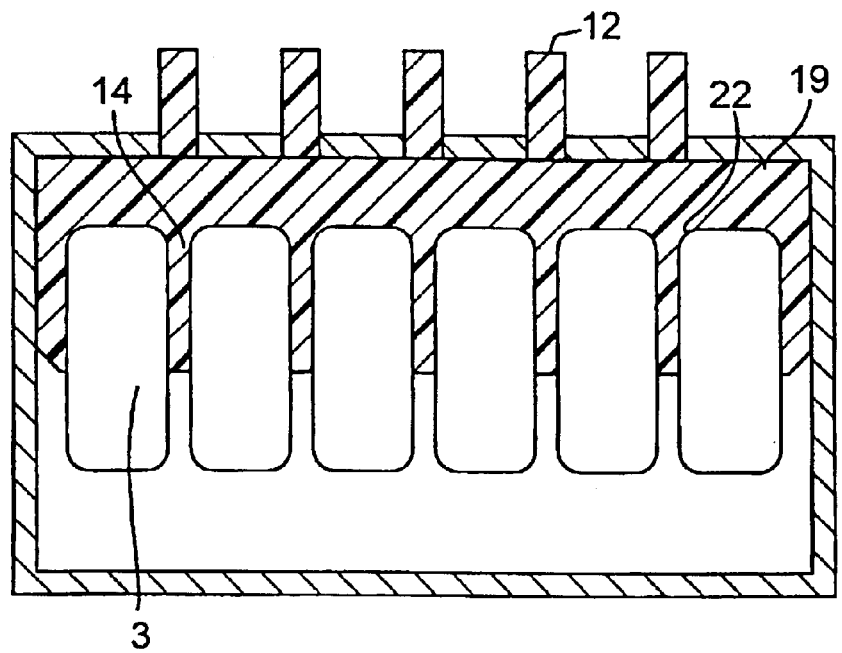
FIG. 8 is a schematic top plane view of the semi-manufactured semiconductor device of FIG. 7 during a filling step of a manufacturing process thereof.

Referring to FIGS. 7 to 10, a semiconductor device will be described hereinafter as an another example of a resin-molded device according to Embodiment 2 of the present invention. FIG. 7 is a cross sectional view of the semiconductor device 1A, and FIG. 8 schematically illustrates the resin running from the resin runners 12 and filling up the channels 14 during the filling step. As clearly shown in FIGS. 7 and 8, each of the metal blocks 3 of the semiconductor device 1A has corners in a vertical and horizontal directions chamfered in a curved or beveled configuration 22. In FIG. 8, the channels 14 defined between the adjacent metal blocks 3 has an upstream and downstream ports located adjacent to the resin runners 12 and air outlets, and both of ports are wider than those of Embodiment 1. The semiconductor device 1A of Embodiment 2 has a structure similar to that of Embodiment 1 with exception of the upstream and downstream ports of the channels 14.

In the semiconductor device 1A having the metal blocks with such a configuration, when the resin package 10 is molded with the semi-manufactured semiconductor device sandwiched in the molding die 15, the fluid resin running from the resin runners 12 to the cavity 18 can be guided into the channels 14 towards the air-outlet through the chamfered corners in a smooth manner. To this end, the channels 14 are thoroughly filled up with resin.

Figure 9:
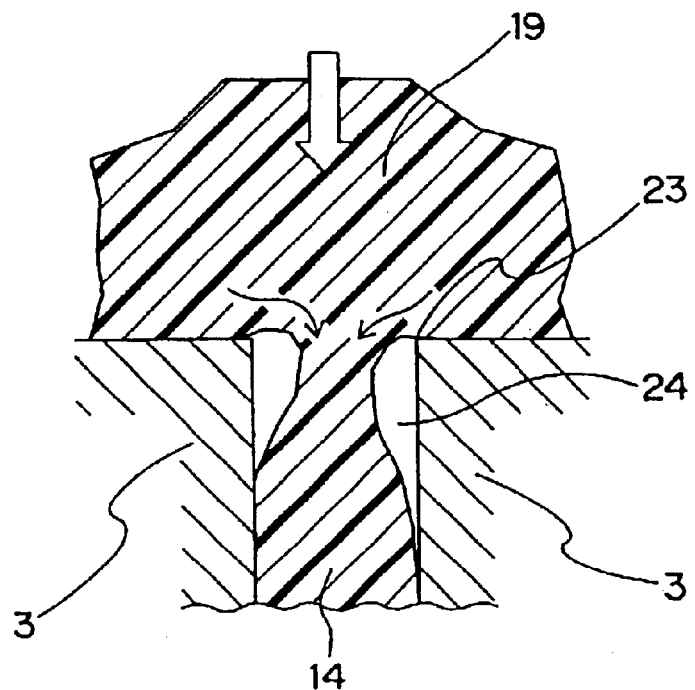
FIG. 9 is an enlarged top plane view of the semiconductor device having metal blocks without chamfered surfaces, illustrating a problem possibly occurred in the filling step of FIG. 8.
Figure 10:
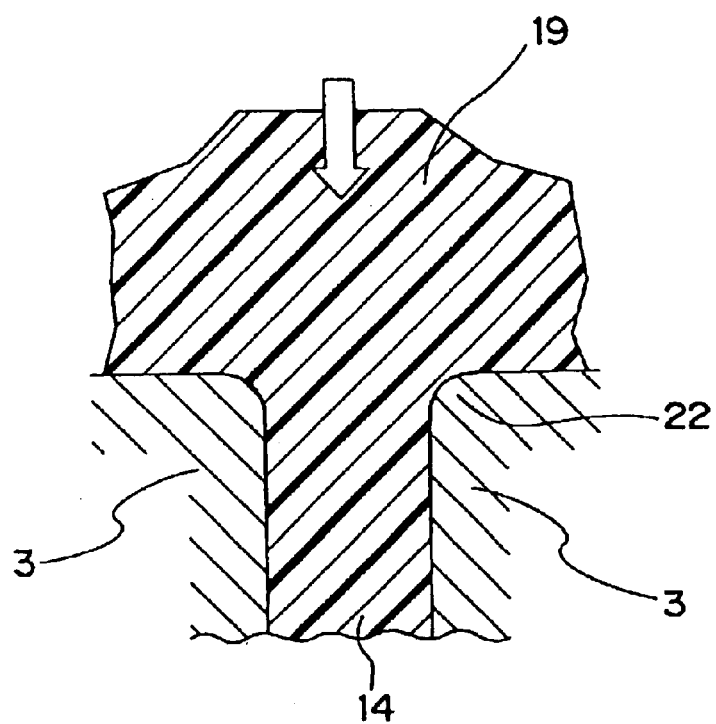
FIG. 10 is an enlarged top plane view of the semiconductor device having metal blocks with chamfered surfaces, illustrating no problem occurred in the filling step of FIG. 8.

Next, the difference between the cases of the metal block 3 with/without chamfered corners will be described herein. The features of filling and fluidity of resin around the upstream port of the channel 14 in both cases are compared to each other. AS shown in FIG. 9, when the metal block 3 has corners not chamfered, the sharp edge 23 could be a peculiar point for flow of the running resin. Thus, the flow of the resin is disturbed around the edge 23 so that the unfilled portion of resin (so-called void) 24 could be formed adjacent to the edge 23. A sufficient electrical isolation cannot be secured at the unfilled portion 24. On the contrary, as shown in FIG. 10, in case where the metal block 3 is designed to have the corners with chamfered configuration 22, the flow of the resin 19 cannot be interrupted since there is no sharp edge provided otherwise disturbing the flow. Therefore, the deviation of the running resin from the metal blocks 3 can be avoided so that the unfilled portion 24 of resin would not be formed at the corners.

An another advantage can be achieved by the chamfered corners of the metal blocks 3 as described hereinafter. A mechanical stress is generated between the metal blocks 3 and resin package 10 due to the difference of their thermal coefficients under thermal changes of the atmosphere where the semiconductor device is exposed, or under thermal changes within the semiconductor device when it is operated. Such a mechanical stress is increased and concentrated at the corners of the metal block 3 and in particular when it has the sharp edges as illustrated in FIG. 9. The concentrated stress causes the problem, for example, that the resin package 10 is peeled off the metal block 3 or that the resin package 10 is cracked. However, the stress is reduced by having the corner chamfered in the curved configuration 22 so that the problems of the peeling-off and the cracking of the resin are eliminated, thereby achieving a reliable semiconductor device 1.

Our experiments and analysis with regard to the stress, it has been revealed that the curved configuration 22 having a radius not exceeding 0.1 mm cannot contribute to reduce the stress sufficiently, and the curved configuration 22 having a radius greater than 2.0 mm cannot further impacts to reduce the stress. Rather, as the radius of the curved configuration 22 is greater than 2.0 mm, disadvantageously, the surface area for radiating heat of the metal block 3 is narrower. Therefore, it is preferable that the radius of the curved configuration 22 falls within a range between 0.1 mm and 2 mm. More preferably, it is in a range between 0.3 mm and 1.5 mm in views of deviation of production accuracy of the curved configuration 22, reduction of stress, and radiating feature of the metal block 3.

Embodiment 3.

Figure 11:
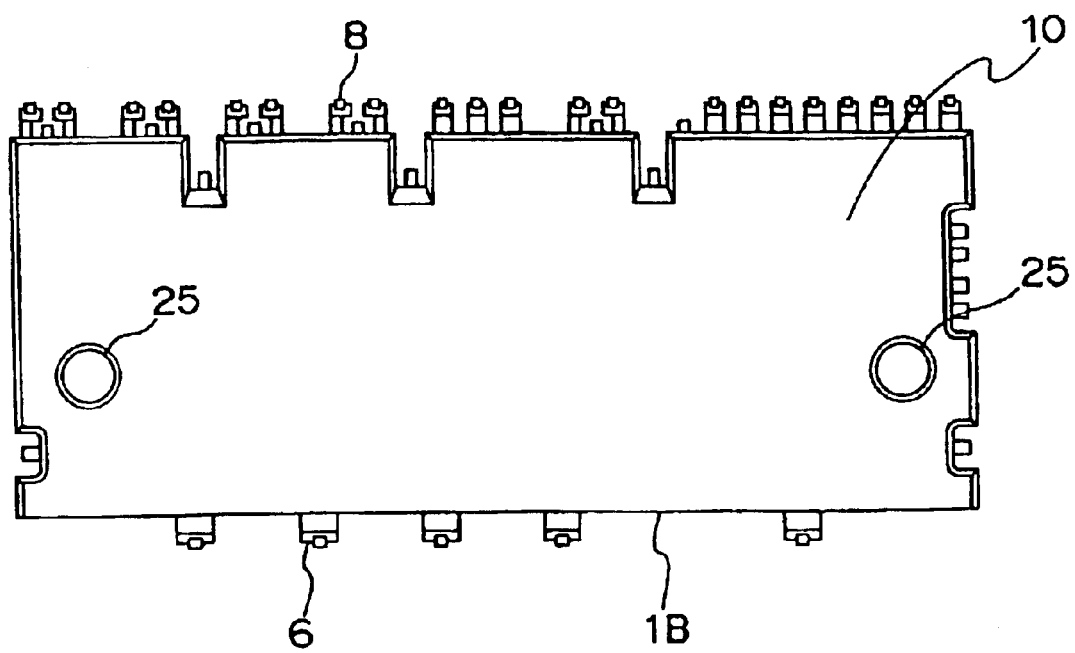
FIG. 11 is a schematic top plane view of the exemplary resin-molded device having a resin package according to Embodiment 3 of the present invention.
Figure 12:
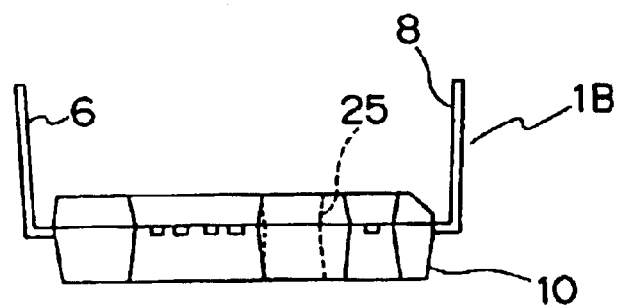
FIG. 12 is a schematic side view of an exemplary semiconductor device having a resin package.
Figure 13:
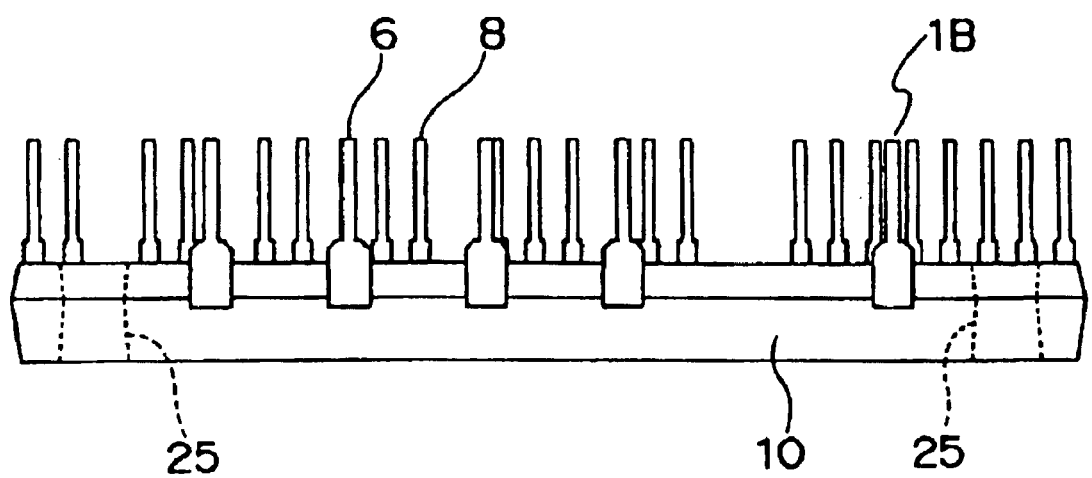
FIG. 13 is a schematic side view of an another semiconductor device according to Embodiment 3.

FIGS. 11, 12 and 13 are a top plane, side, and front views, respectively, of an semiconductor device according to Embodiment 3. This semiconductor device 1 is so called a "full-molded" device having the resin package 10 entirely encompassing the metal block 3. Also, the semiconductor device has a plurality of fixing holes 25 for fixing it to the external radiator (not shown). It is fixed to the external radiator, in general, by applying a radiating grease between the semiconductor device 1 and the external radiator, and by fastening screws through the fixing holes into threaded holes positioned corresponding to the fixing holes 25.

Figure 14:
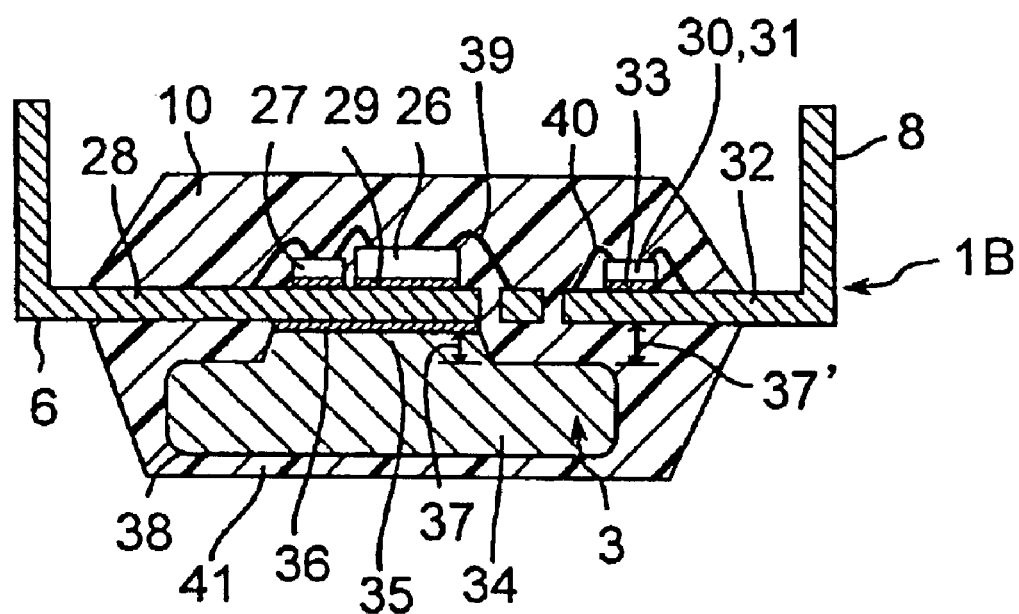
FIG. 14 is a schematic cross sectional view of the semiconductor device according to Embodiment 3.

FIG. 14 is a schematic cross sectional view of the semiconductor device according to Embodiment 3. As shown, the semiconductor device 1B includes the power elements such as Insulated Gate Bipolar Transistors (referred to simply as "IGBTS" herein) 26 and Fly Wheel Diodes (referred to simply as "FWDs" herein) 27. The first lead frame 6 includes a power circuitry portion 28, which IGBT 26 and FWD 27 are mounted on and electrically connected to via solder 29. Also, the semiconductor device 1B includes control elements such as Low Voltage Intelligent Circuits (referred to simply as "LVICS" herein) 30 and High Voltage Intelligent Circuits (referred to simply as "HVICs" herein) 31. The second lead frame 8 includes a control circuitry portion 32, which LVICs 30 and HVICs 31 are mounted on and electrically connected to via solder 33.

In FIG. 14, while IGBTs 26 and FWDs 27 are attached via solder 29 on the upper surface of the first lead frame 6, the metal block 3 is provided on the lower surface thereof via solder 36. The metal block 3 includes a main portion (first portion) 34 and a plateau portion (second portion) 35 extruding from the main portion 34. Attached to the first lead frame 6 via the solder layer 36 is the plateau portion 35. The main portion 34 of the metal block 3 extends laterally beyond a region beneath the second lead frame 8 so as to enlarge the radiating surface. However, the main portion 34 is spaced from the second lead frame 8 in a vertical direction to secure good electrical isolation therebetween. The main portion 34 of the metal block 3 includes vertical and lateral corners finished to have curved configurations 38 so that the running resin are smoothly guided into the channels and no substantial stress is generated at the corners of the metal blocks 3.

Electrical connections are provided between IGBT 26 and FWD 27, between IGBT 26 and the corresponding lead frame, and between FWD 27 and the corresponding lead frame, for example via aluminum wires 39 having a cross section of which diameter is about 300 μm. Also, LVIC 30 and HVIC 31 are electrically connected to the corresponding lead frame 8 via gold wires 40 having a cross section of which diameter is less than those of the aluminum wires 39.

The resin package 10 encompasses together and seals the power elements 26, 27, control elements 30, 31, the metal blocks 3, and the power circuitry portion 28 and the control circuitry portion 32 of the lead frame 6, 8. Our experiment and simulation revealed that the gap 37' between the metal block 3 and the control circuitry portion 32 in FIG. 14 should be approximately 0.4 mm or more in order to avoid malfunction of LVICs 30 or HVICs 31 due to electrical noise. More preferably, the gap is required to be about 0.5 mm or more. Therefore, the plateau portion 35 of the metal block 3 has a height 37 in FIG. 14, which should be about 0.5 mm or more. More preferably, it should be 1 mm or more because the control circuitry portion 32 may shift in the vertical direction during the manufacturing process including the molding step. Also, formed on the bottom surface of the metal block 3 is a resin layer 41 having a thickness of about 0.3 mm or more in order to secure electrical isolation with the external radiator (not shown). Meanwhile, since the resin package 10 has a thermal conductivity of about one-hundredth (1/100) of that of the metal block 3 made of copper and aluminum, the resin layer 41 is required to be thin so as to radiate heat to the external radiator. Thus, even in case where the metal block 3 has the extended radiating surface, the thickness of the resin layer 41 is preferably 1.0 mm or less for the good radiating feature. More preferably, the thickness is 0.6 mm or less to improve the radiating feature, for example, for the semiconductor device generating greater heat. Therefore, the thickness of the resin layer 41 falls within the range preferably between 0.3 mm and 1.0 mm, and more preferably between 0.3 mm and 0.6 mm.

The full-molded semiconductor device as described above can secure electrical isolation with the external radiator. Also, each of the full-molded semiconductor devices can be inspected whether it satisfies the required dielectric breakdown voltage, and then supplied to endusers. Therefore, when the end-user assembles the full-molded semiconductor devices with the external radiator, an additional component of heat-conductive insulating material used for the conventional semiconductor device can be eliminated for transmitting heat and securing electrical isolation with the semiconductor device. To this end, advantageously, the full-molded semiconductor device facilitates the assembly with the external radiator and prevents an assembly failure and eliminates a problem due to a defect of the additional component.

Figure 15:
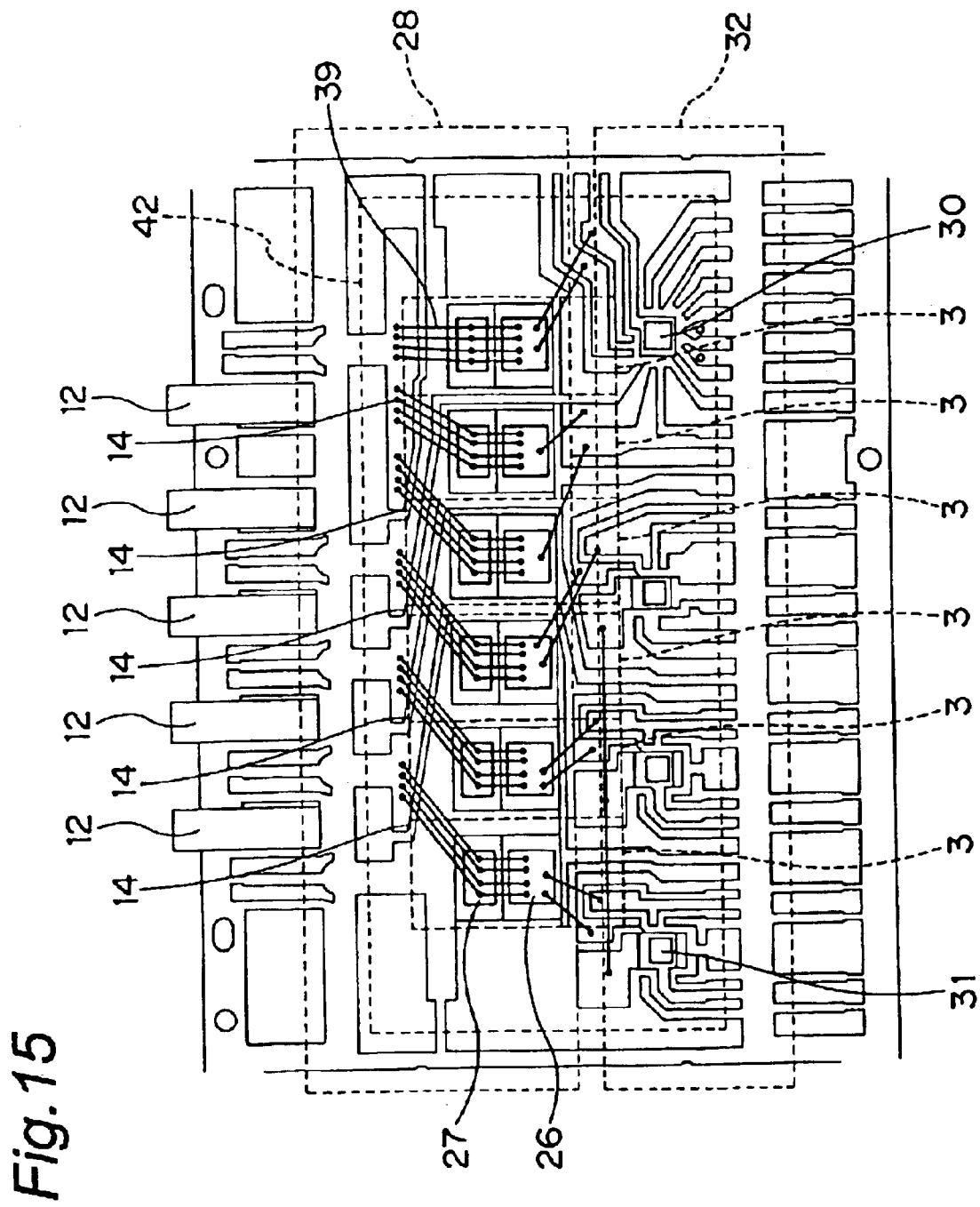
FIG. 15 is a top plane view of the semi-manufactured semiconductor device according to Embodiment 3 before a resin package filling step of a manufacturing process thereof.
Figure 16:
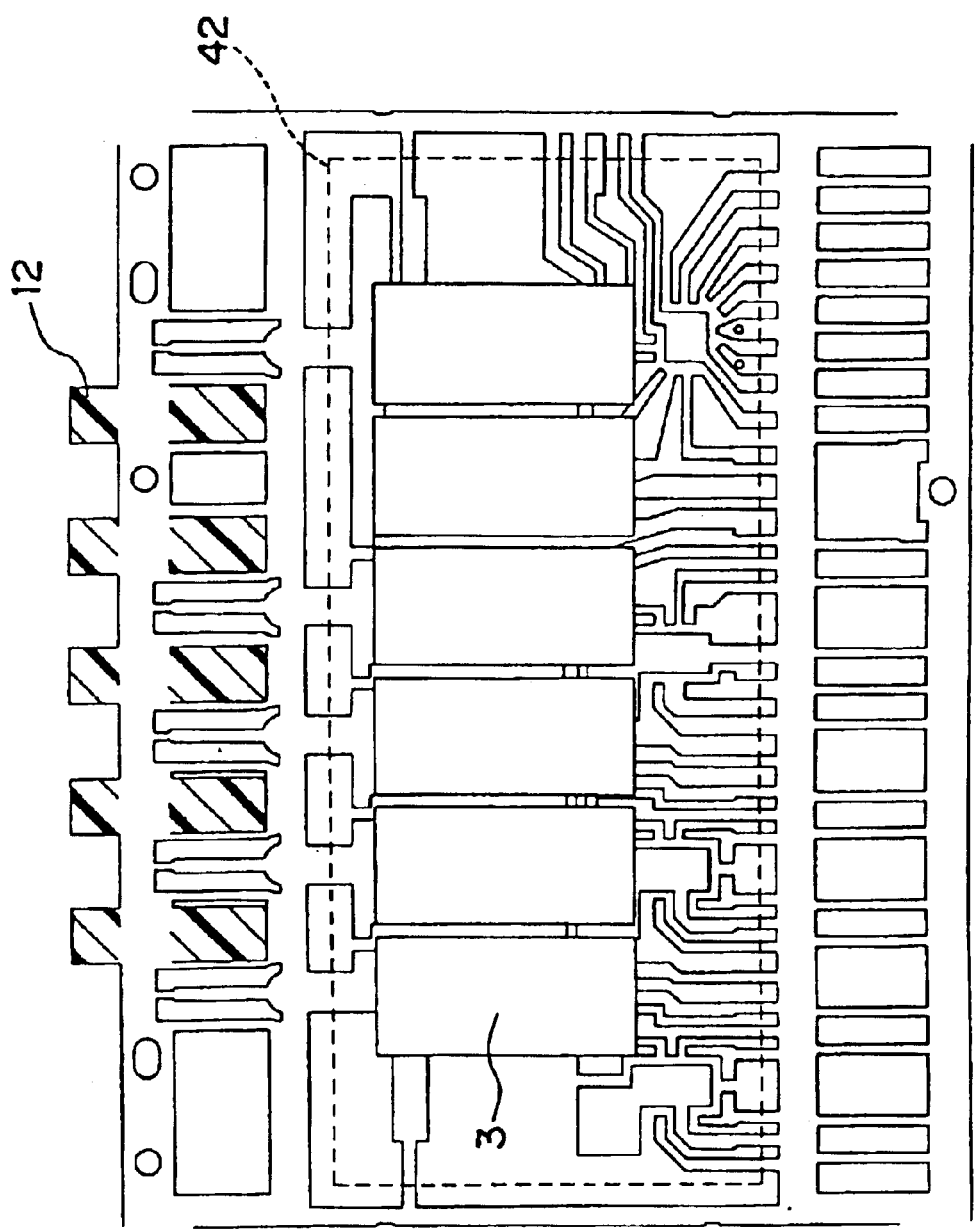
FIG. 16 is a bottom plane view of the semi-manufactured semiconductor device before the filling step of FIG. 15.
Figure 17:
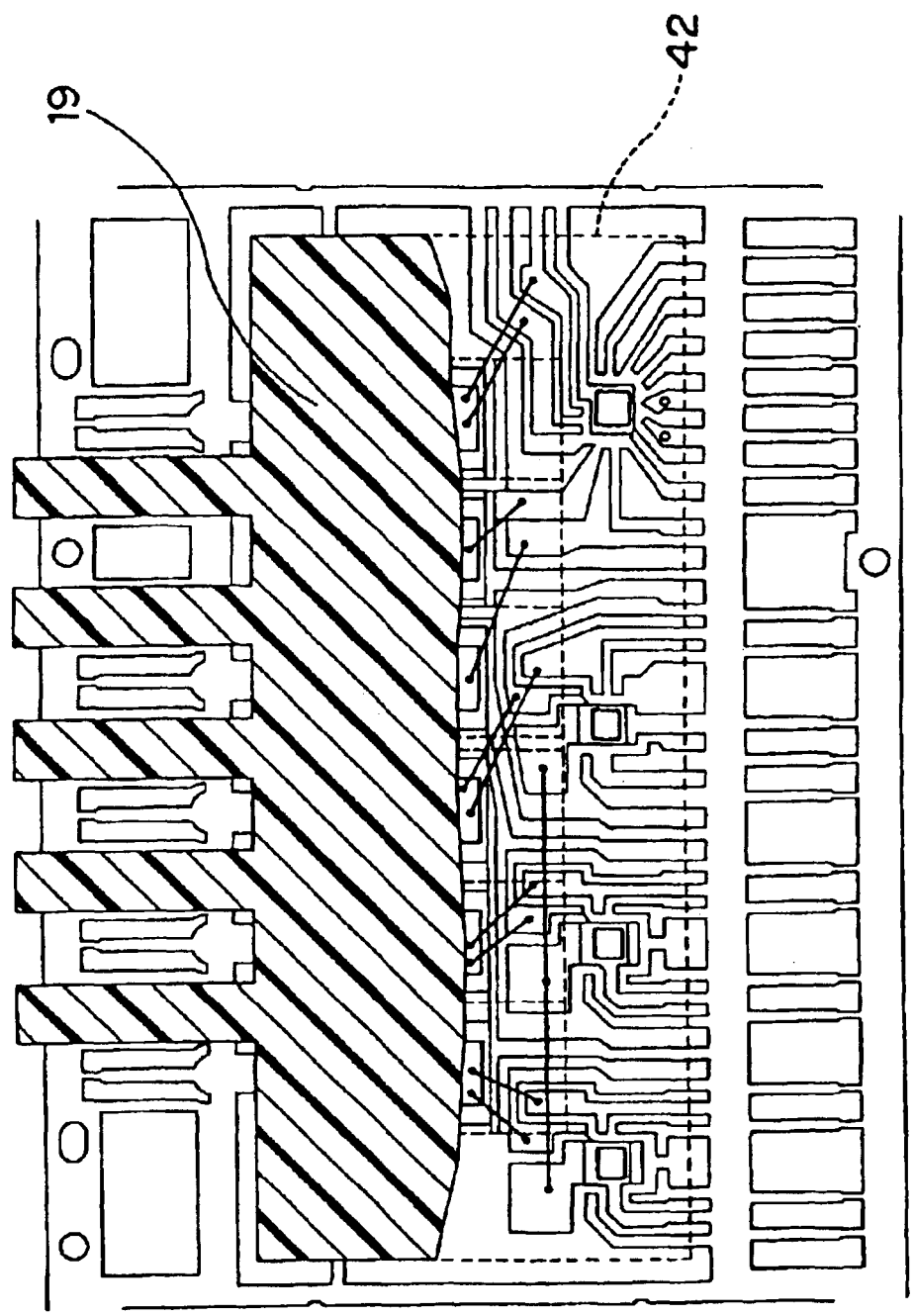
FIG. 17 is a top plane view of the semi-manufactured semiconductor device during the filling step of FIG. 15.
Figure 18:
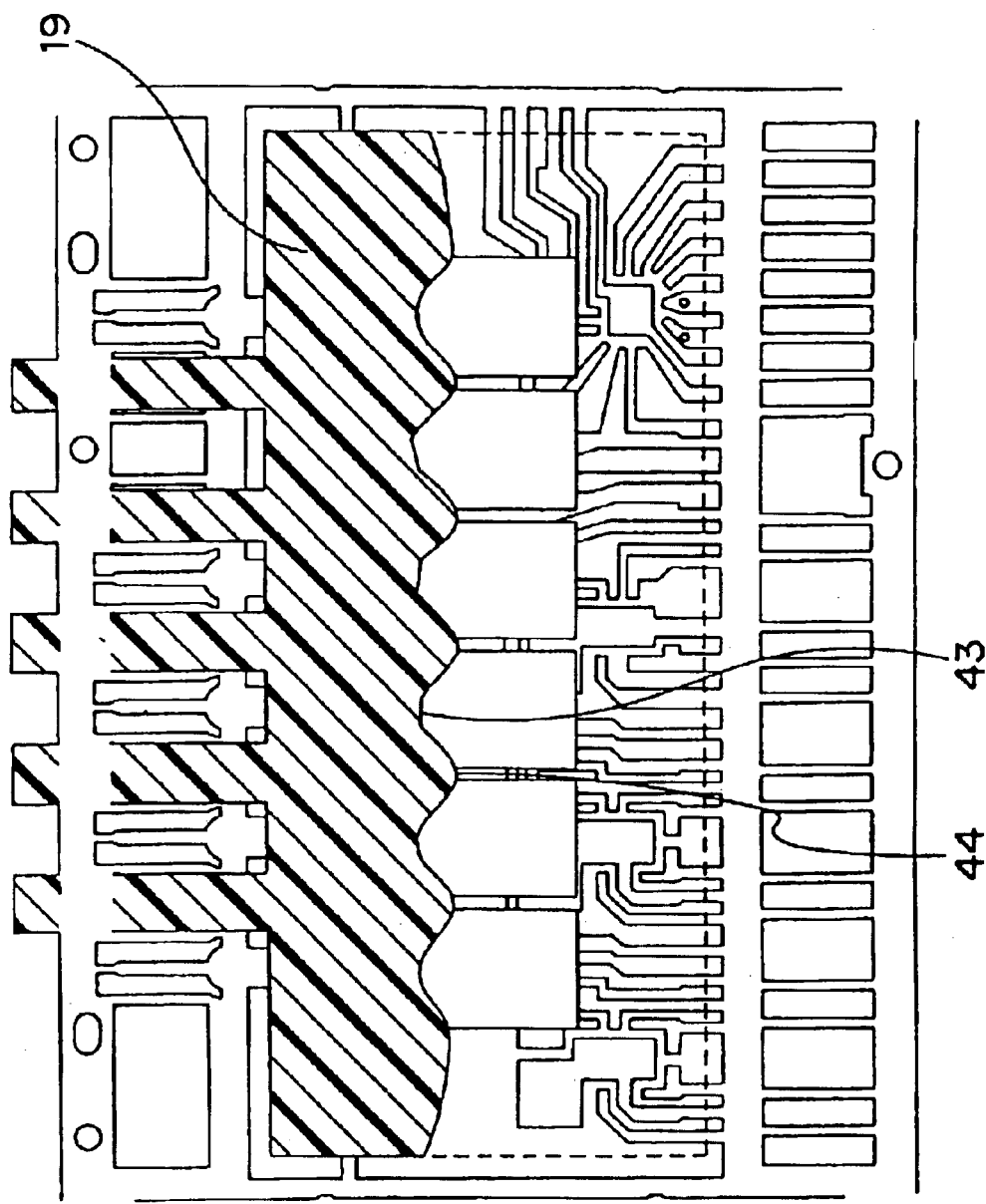
FIG. 18 is a bottom plane view of the semi-manufactured semiconductor device during the filling step of FIG. 15.

FIGS. 15 and 16 are a top and bottom plane views of the semi-manufactured semiconductor device before the resin filling step, and in particular, illustrating outlines of the power circuitry portion 28, the control circuitry portion 32, and the resin package 10 (indicated by numerical notation 42). Also shown in those drawings, the resin runners 12 of the molding die 15 are arranged on the extension line overlapping the channel 14 defined between the adjacent metal blocks 3. Thus, the running resin 19 injected from each runner 12 thoroughly fills up the channel 14 in an efficient manner, as well as Embodiment 1. Although FIGS. 17 and 18 are similar to FIGS. 15 and 16, respectively, they illustrate the semi-manufactured semiconductor device during the filling step. In this filling step, as the channels 14 are filled up with the running resin, the back line 43 of the running resin 19 is running slightly behind the front line 44 beneath the metal block 3 as illustrated in FIG. 18. However, since the fluid speed of the resin 19 running through each of the channels 14 is constant, that is, the front line 44 of each channel 14 is even, the channels 14 are filled up with resin 19 from one side so that air remaining beneath the metal blocks 3 are evacuated. In other words, in case where the fluid speed of the resin 19 running through each of the channels 14 is different from one another, air might be trapped between the resin turning around and running from other side and the resin injected from the resin runners 12. Then, the trapped air might cause insufficiency of electrical isolation due to the unfilled portion of resin. However, in the semiconductor device according to the present embodiment, the resin runners 12 are arranged in appropriate positions so that the trapped air can be eliminated.

After the filling step, a curing step for curing the fluid resin 19 filled in the cavity is performed. The semiconductor device so manufactured includes a plurality of resin inlets at positions corresponding to the resin runners 12 of the molding die 15. Thus, according to the present embodiment, similar to Embodiment 1, each of the resin inlets of the semiconductor device 1 opposes to the corresponding channel 14 and is positioned on an extension line overlapping the channel 14.

Figure 19:
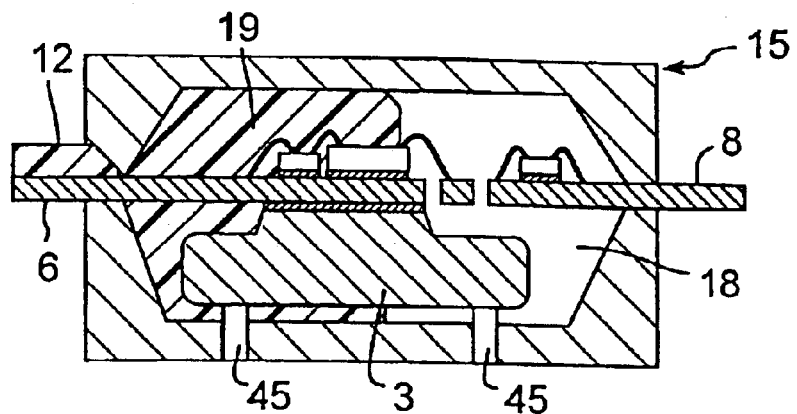
FIG. 19 is a cross sectional view of the semi-manufactured semiconductor device during the filling step of FIG. 15.

As above, it is preferable that the insulating resin layer 41 on the bottom surface of the metal block 3 is controlled so as to have thickness thin and even for improving both of the radiating and insulating performances. As illustrated in FIG. 19, the lower die 17 of the molding die 15 includes a plurality of pins 45 opposing to the bottom surface of the metal block 3, which can be moved back and forth in the cavity 18. The movable pins 45 are connected to and driven by a driving mechanism including a cylinder (not shown). The movable pins 45 extend upwardly and keep supporting the metal block 3 until the cavity of the molding die 15 is entirely filled up with the fluid resin 19 for controlling the thickness of the resin layer to be even. After filling up the cavity with the fluid resin 19 and before curing it, the movable pins 45 are contracted in the molding die 19 while the space occupied by the movable pins 45 are filled up with resin positioned around them.

Figure 20:
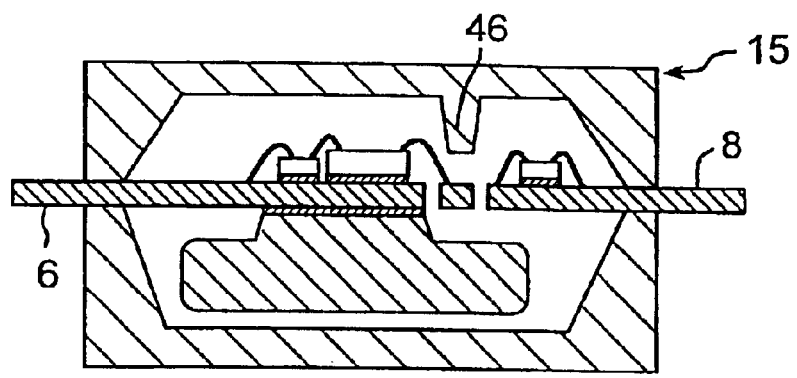
FIG. 20 is a cross sectional view of an another semi-manufactured semiconductor device according to Embodiment 3, illustrating a flow barrier.
Figure 21:
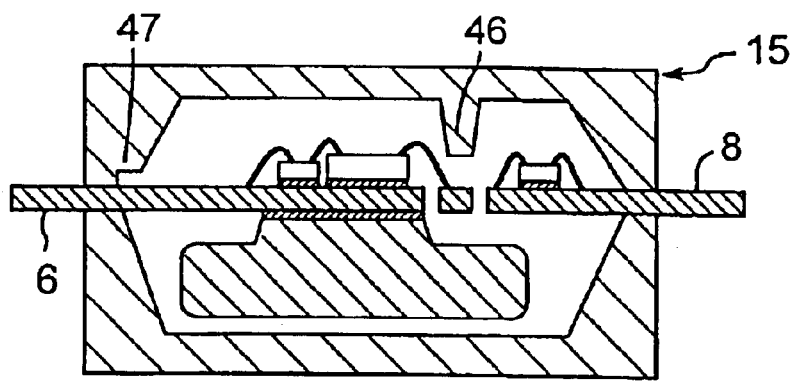
FIG. 21 is a cross sectional view of an another semi-manufactured semiconductor device according to Embodiment 3, illustrating an evaginating portion.
Figure 22:
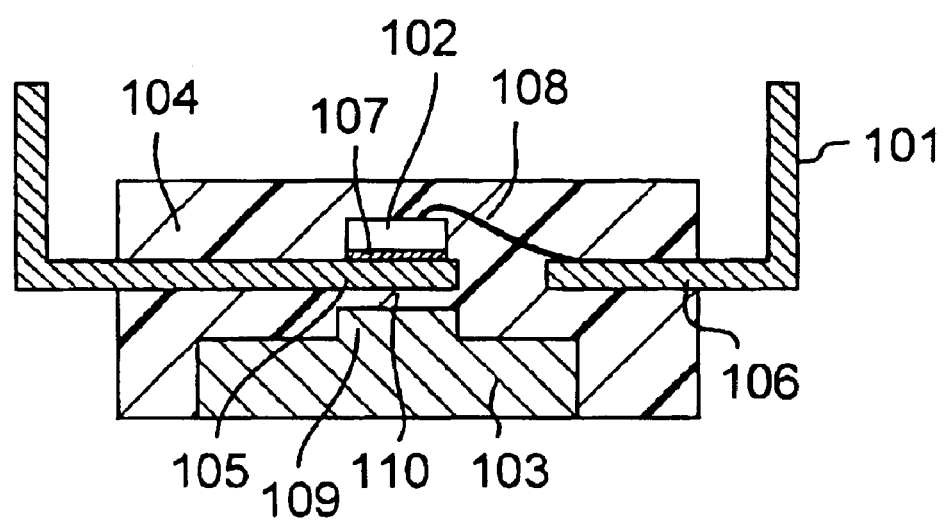
FIG. 22 is a cross sectional view of a conventional semiconductor device.
Figure 23:
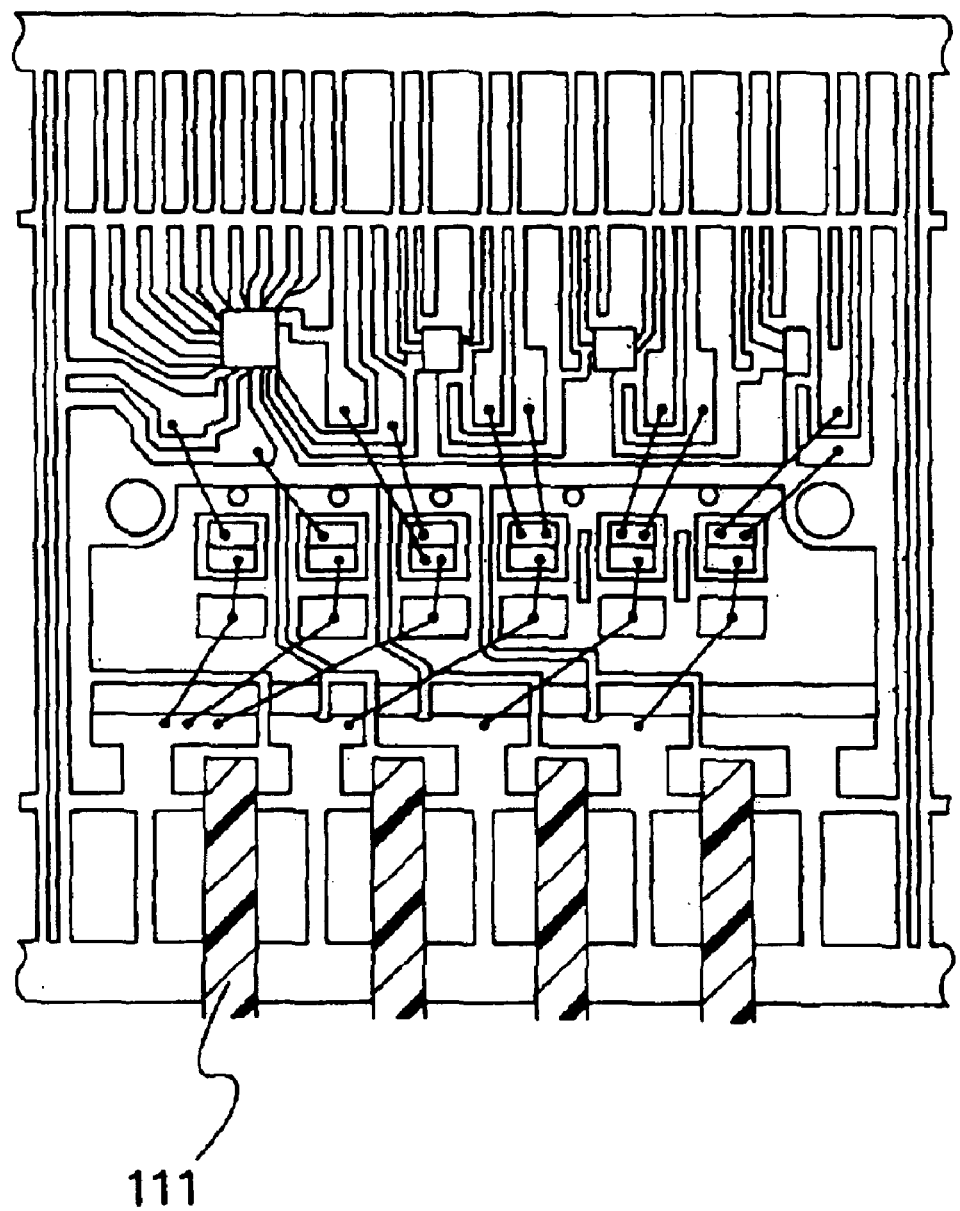
FIG. 23 is a top plane view of the semi-manufactured semiconductor device of FIG. 22 before a resin filling step of a manufacturing process thereof.
Figure 24:
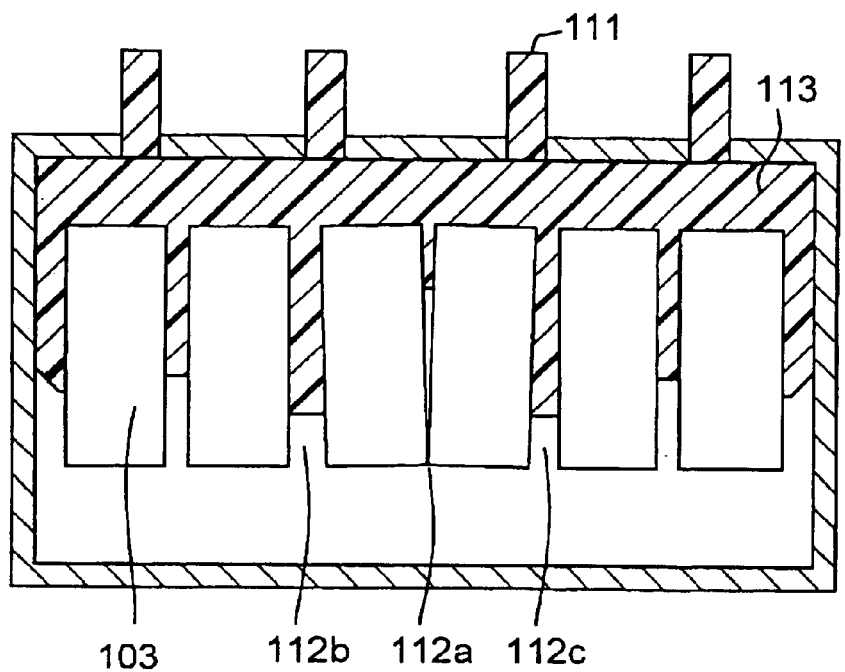
FIG. 24 is a schematic top view of the semi-manufactured semiconductor device of FIG. 23 during the filling step.
Figure 25:
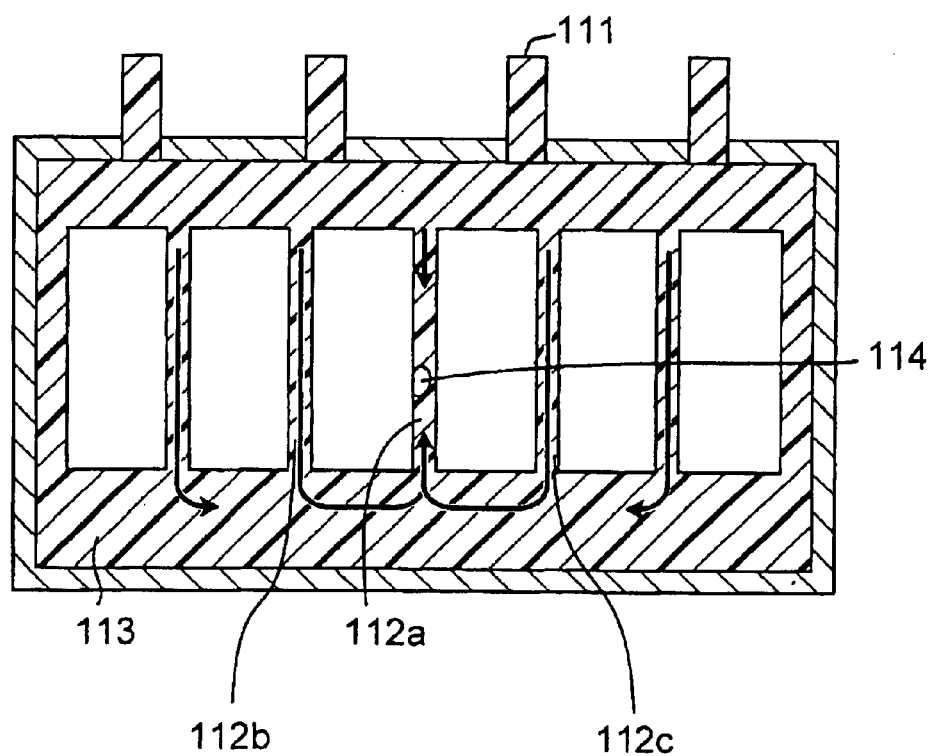
FIG. 25 is a schematic top view of the semi-manufactured semiconductor device of FIG. 23 after the filling step.
Figure 26:
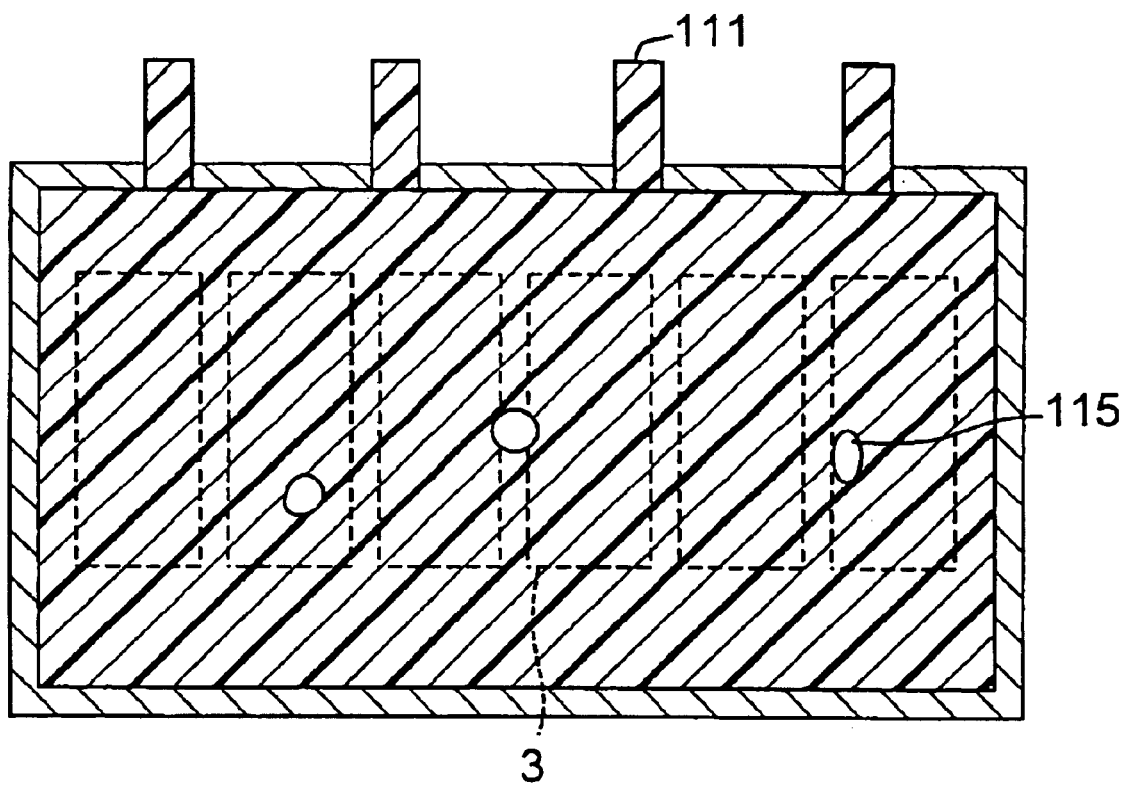
FIG. 26 is a schematic bottom view of the semi-manufactured semiconductor device FIG. 23 after the filling step.

In order further to facilitate the running resin 19 to be filled in particular under the metal block 3, a flow barrier can be provided above the lead frame for controlling the flow of the running resin 19. The blow barrier may include one or more boss or wall 46 positioned between the first and second lead frames 6, 8 and extending downwardly from the upper die 16 as illustrated in FIG. 20. In addition to the boss or wall 46, the flow barrier may include one or more evaginating portion 47 formed on the upper die 16. Also, the cavity of the molding die 15 may be decompressed during the resin filling step so that the running resin 19 can fill the space under the metal block in an even smoother manner.

As described above, in the semiconductor device of Embodiment 3, the resin inlets 12 are arranged in appropriate positions and the metal block 3 has chamfered corners for facilitating the running resin 19 to be filled in the channels 14 between the metal blocks 3. Also, the metal block 3 is entirely covered by the resin package without being exposed. Therefore, in the semiconductor device having a plurality of metal blocks for achieving excellent radiating features, the insulating performance can also be improved.

While exemplary structures of the resin-molded devices and the manufacturing apparatus are described above, the resin package can be made of resin material including thermosetting resin such as epoxy resin and silicone resin, thermoplastic resin such as polyphenylene salfide (PPS), and the compositions thereof. Also, the resin material may include any inorganic material such as silica and alumina and/or fillers having metal micro-powder coated with insulating material for improving thermal conductivity, for controlling linear expansivity and for reinforcing mechanical strength. Although some particular material for resin package 10 are described herein, the scope of the present invention cannot be limited thereby.

Although the semiconductor devices of the aforementioned embodiments are illustrated to have six metal blocks, the present invention can be applied to any semiconductor devices having two or more metals blocks. Also, the solder is used for attaching or bonding the metal blocks to the lead frames and attaching the power elements and the control elements to the lead frames or the metal blocks. However, as the ordinary persons skilled in the art can easily conceive, any other attaching means can be utilized for attaching those elements. For example, the attaching means includes silver solder and any other conductive adhesives. Also, the attaching means can be a mechanical attachment by crimping, and/or a direct attachment by applying any electrical or thermal energy such as ultrasonic and laser.

Further, wires are used for electrical connection between the power/control elements and lead frames and between the lead frames in the aforementioned embodiments. However, the scope of the present invention cannot be limited by material and a diameter of the wire, any electrically connecting means can be utilized. Such electrically connecting means include electrically conductive wires of silver or copper, electrically conductive adhesives of solder or silver solder, and electrical connection with a mechanical attachment by crimping and/or a direct attachment by applying any electrical or thermal energy such as ultrasonic and laser. In addition, the electrically connecting means may simply be a contact if the electrical connection can be secured.

As described above, many advantages can be achieved according to the aspects of the present invention. Firstly, fluid resin is injected from the resin runners of the molding die and the resin inlets of the semiconductor device, and each of them opposes to the channel and is positioned on an extension line overlapping the channel. Therefore, the fluid resin can be controlled so as to run through each of the channels at the same speed and fills it up at substantially the same timing. This prevents insufficient filling in the channels with resin, shifting of the metal blocks, and electrical contact and/or the reduced dielectric breakdown voltage between the metal blocks.

Also, since each of the metal blocks is attached to the corresponding one of the lead members, positioning of the metal blocks can be facilitated during the filling step in an efficient manner. This also controls the width of the channels to be even, and avoids the unfilled portions and the insulting failure.

The metal blocks are electrically insulated from each other, thus, a plurality of metal blocks that have different potentials (voltage) can be incorporated in the semiconductor device, which in turn can be designed to have more sophisticated functions.

The channel portions have width substantially the same as those of others, so that the fluid resin can be controlled so as to run through each of the channels at the same speed and fills it up at substantially the same timing.

Also, each of the channel portions is enlarged at the corners adjacent to the corresponding resin inlet so that the channels can be filled up with resin in even more smooth manner.

Each of the metal blocks includes a plateau portion attached to the lead frame and a second portion greater than the first portion that is spaced from the lead frame. Thus, while electrical isolation between the metal block and the lead frame is secured, the size of the metal blocks can be optimized so that the radiating performance of the semiconductor device can be enhanced without increasing the size thereof.

Also, each of the metal blocks opposes to the corresponding one of the electronic elements via the corresponding one of the lead frames positioned therebetween. Thus, wire connection between electronic elements can be made in a simple manner. Also, a circuitry design of the complicated circuits can be facilitated. In addition, a manufacturing apparatus and steps commonly used for the semiconductor devices, including a die-bonding step for bonding the elements on the lead frame and a wire-bonding step can be incorporated.

Each of the metal blocks opposes to the corresponding one of the electronic elements, heat generated from the elements can be radiated in an efficient manner.

The metal blocks are completely encompassed by the resin package without being exposed, thus, in the assembly process of the end-user, an additional component of heat-conductive insulating material used for the conventional semiconductor device can be eliminated. To this end, the full-molded semiconductor device facilitates the assembly with the external radiator. Also, the insulting and radiating performances of the semiconductor device can be inspected and assured by itself, problems such as insulating and radiating failures can be precluded prior to the assembly process of the end-users.

Each of the electronic elements is attached to the corresponding one of the metal blocks, heat generated by the elements can be radiated through a shortest path.

What is claimed is:

1. A resin-molded device comprising:

electronic elements spaced from one another;

lead members electrically connected to said electronic elements;

metal blocks spaced from one another to define channel portions therebetween; and a resin package comprising an electrically insulating material, the resin package holding said electronic elements, said lead members, and said metal blocks;

wherein said resin package comprises resin inlets through which fluid resin is configured to be injected by resin runners aligned with the resin inlets, the resin inlets opposing said channel portions.

2. The resin-molded device according to claim 1, wherein at least one of said metal blocks is attached to at least one of said lead members.

3. The resin-molded device according to claim 1, wherein said metal blocks are electrically insulated from one another.

4. The resin-molded device according to claim 1, wherein the channel portions have substantially equal widths.

5. The resin-molded device according to claim 1, wherein at least one of said metal blocks comprises a first portion attached to at least one of said lead members and a second portion connected to the first portion and spaced from the at least one of said lead members.

6. The resin-molded device according to claim 1, wherein at least one of said lead members comprises a first surface on which at least one of said electronic elements is mounted, and a second surface opposing the first surface, on which at least one of said metal blocks is attached.

7. The resin-molded device according to claim 1, wherein at least one of said metal blocks opposes at least one of said electronic elements via a lead portion of the lead member connected to the at least one electronic element.

8. The resin-molded device according to claim 1, wherein at least one of said metal blocks is completely encompassed by the resin package.

9. The resin-molded device according to claim 1, wherein at least one of said electronic elements is attached to at least one of said metal blocks.

10. The resin-molded device according to claim 1, wherein at least one of the channel portions is enlarged at a corner adjacent the opposing resin inlet.

11. The resin-molded device according to claim 1, wherein at least one of the metal blocks comprises a corner that is radiused or chamfered.

12. The resin-molded device according to claim 1, wherein at least one of the channel portions comprises first and second portions, the first portion adjacent the opposing resin inlet and having a first width between adjacent metal blocks, the second portion having a second width between the adjacent metal blocks, the first width being greater than the second width.

13. The resin-molded device according to claim 1, wherein adjacent metal blocks are configured such that a first distance between end portions of the adjacent metal blocks is greater than a second distance between portions other than the end portions of the adjacent metal blocks.

14. A resin-molded device comprising:

a plurality of electronic elements spaced from each other;

a plurality of lead members, each one of the lead members electrically connecting to a corresponding one of the electronic elements;

a plurality of metal blocks spaced from each other so that a plurality of channel portions are defined between the metal blocks, and each of the metal blocks arranged to correspond to at least one of the electronic elements and the lead members connected to the electronic elements; and a resin package of electrically insulating material molded to hold together the plurality of the electronic elements, the lead members, and the metal blocks;

wherein the resin package comprises a plurality of resin inlets through which fluid resin is injected, wherein each of the resin inlets opposes to a corresponding one of the channel portions, and wherein each of the channel portions is enlarged at corners adjacent to the a corresponding resin inlet.

* * * * *